United States Patent
Nomaguchi et al.

(10) Patent No.: US 7,871,840 B2
(45) Date of Patent: Jan. 18, 2011

(54) METHOD FOR MANUFACTURING SEMICONDUCTOR OPTICAL DEVICE USING INDUCTIVE COUPLED PLASMA-ENHANCE CVD

(75) Inventors: Toshio Nomaguchi, Kanagawa (JP); Tetsuya Hattori, Kanagawa (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 338 days.

(21) Appl. No.: 11/488,004

(22) Filed: Jul. 18, 2006

(65) Prior Publication Data

US 2007/0020954 A1    Jan. 25, 2007

(30) Foreign Application Priority Data

Jul. 19, 2005    (JP)    ............... 2005-209050

(51) Int. Cl.
*H01L 21/00*    (2006.01)
(52) U.S. Cl. .................... 438/39; 438/778; 257/E21.09
(58) Field of Classification Search .................. 438/39, 438/689, 778; 372/43.01–46.01; 257/E21.269, 257/E21.279, E21.28, E21.293, E21.09, E33.006
See application file for complete search history.

(56) References Cited

U.S. PATENT DOCUMENTS

| | | | | |
|---|---|---|---|---|
| 5,222,091 A | * | 6/1993 | Holmstrom et al. | 372/45.01 |
| 5,504,768 A | * | 4/1996 | Park et al. | 438/39 |
| 5,783,844 A | * | 7/1998 | Kobayashi et al. | 257/103 |
| 5,789,275 A | * | 8/1998 | Lee et al. | 438/40 |
| 6,075,799 A | * | 6/2000 | Uchida et al. | 372/27 |
| 6,171,876 B1 | * | 1/2001 | Yuang et al. | 438/22 |
| 6,233,266 B1 | * | 5/2001 | Kawasumi | 372/46.01 |
| 6,689,631 B2 | * | 2/2004 | Chang | 438/29 |
| 6,711,192 B1 | * | 3/2004 | Chikuma et al. | 372/43.01 |
| 6,983,004 B2 | * | 1/2006 | Jikutani et al. | 372/46.01 |
| 7,208,338 B2 | * | 4/2007 | Chiba et al. | 438/45 |
| 7,585,688 B2 | * | 9/2009 | Oka et al. | 438/31 |
| 2002/0109149 A1 | * | 8/2002 | Chang | 257/98 |
| 2007/0184181 A1 | * | 8/2007 | Wada | 427/69 |

FOREIGN PATENT DOCUMENTS

| JP | 01 256184 A | 10/1989 |
|---|---|---|
| JP | 2003-264334 A | 9/2003 |
| JP | 2004-128360 A | 4/2004 |
| JP | 2004-207564 A | 7/2004 |

* cited by examiner

*Primary Examiner*—Khiem D Nguyen
(74) *Attorney, Agent, or Firm*—Venable LLP; Michael A. Sartori; Kyle D. Petaja

(57) ABSTRACT

The present invention provides a semiconductor laser diode prevents not only the adhesion of the upper electrode but the heat dissipation of the mesa from degrading. The laser diode includes a substrate, portion of which forms a mesa including an active layer, an insulating layer formed so as to bury the mesa, and an electrode formed on the mesa and the insulating layer. This insulating layer may be selected from $SiO_2$, SiON, SiN, $Al_2O_3$ or $ZrO_2$ and formed by the inductive coupling plasma-enhanced chemical vapor deposition (ICP-CVD) technique.

8 Claims, 9 Drawing Sheets

METHOD FOR MANUFACTURING SEMICONDUCTOR OPTICAL DEVICE USING INDUCTIVE COUPLED PLASMA-ENHANCE CVD

BACKGROUND OF THE INVENTION

1. Field of the Invention

The present invention relates to a semiconductor optical device and a method for manufacturing the semiconductor optical device.

2. Related Prior Art

The Japanese Patent application published as JP-2003-264334A has disclosed a semiconductor laser diode that provides a substrate with a mesa formed on the mesa and a buried layer burying the mesa. The laser diode further provides trenches in the buried layer. The Japanese Patent published as JP-2004-128360A has also disclosed a laser diode with trenches in the buried layer. The trench in this patent is filled with resin and the upper electrode of the laser diode is formed directly on the resin, accordingly, the parasitic capacitance formed between the upper and lower electrodes may be reduced.

Conventionally, the trench in the buried layer is used to be formed by, what is called, the wet etching. However, the trench reaches the semiconductor substrate and the depth thereof becomes a few micrometer or larger. To form such deep trench by the wet etching has been quite hard to precisely control the etching condition thereof. Therefore, the dry etching such as the reactive ion etching (RIE) has been proposed to form the deep trench. Although the dry etching enhances the controllability of the etching, it forms the trench with steep side surface and, when the interconnection is formed over the trench by the metal, the thickness of the metal at the edge of the trench becomes so thin or disconnects there in the extreme condition.

Accordingly, a method to fill the trench with a resin has been proposed. However, in the case that the resin fills the trench, the adhesion between the wiring for the upper electrode and the resin becomes a subject. Further, the current supplied in the mesa portion to emit light sometimes reaches some thirty or forty milli-ampere, which generates heat in the mesa portion. When the resin fills in the trench formed in both sides of the mesa portion, the heat generated in the mesa portion may be effectively dissipate therefrom because the thermal conductivity of the resin usually smaller than that of the semiconductor materials.

Therefore, the present invention is to provide a method for manufacturing a semiconductor optical device that reduces the parasitic capacitance between the substrate and the electrode, and to provide the semiconductor optical device.

SUMMARY OF THE INVENTION

A first process according to the present invention comprises steps of: (a) forming semiconductor layers on the semiconductor substrate, (b) forming a mesa by etching the semiconductor layers and a portion of the substrate, (c) burying the mesa with an insulating layer, and (d) forming an electrode on the insulating layer.

A second process according to the present invention comprises steps of: (a) forming semiconductor layers on the semiconductor substrate, (b) forming a mesa by etching, (c) forming buried layers each made of compound semiconductor material, (d) etching the buried layers and a portion of the substrate to form a pair of trenches putting the mesa therebetween, (e) burying the trench with an insulating layer; and (f) forming an electrode on the insulating layer.

The semiconductor layers include an active layer and a contact layer in uppermost thereof. One feature of the processes according to the present invention is that the insulating layer is formed by the inductive coupled plasma-enhanced chemical vapor deposition. Therefore, even the insulating layer is necessary to be formed thick; a reasonable deposition rate may be realized without introducing an internal stress within the layer and with good adhesion to the electrode formed thereon.

The insulating layer may be made of material selected from $SiO_2$, $SiN$, $SiON$, $Al_2O_3$ or $ZrO_2$. Since these materials have thermal conductivity higher than that of the resin, which is conventionally used to fill the trench, the heat generated in the mesa may be effectively dissipated therefrom.

DESCRIPTION OF PREFERRED EMBODIMENTS

Next, embodiments of the present invention will be described as referring to accompanying drawings. In the drawings, the same symbols or numerals will refer to the same elements without overlapping explanations.

First Embodiment

Figure 1:
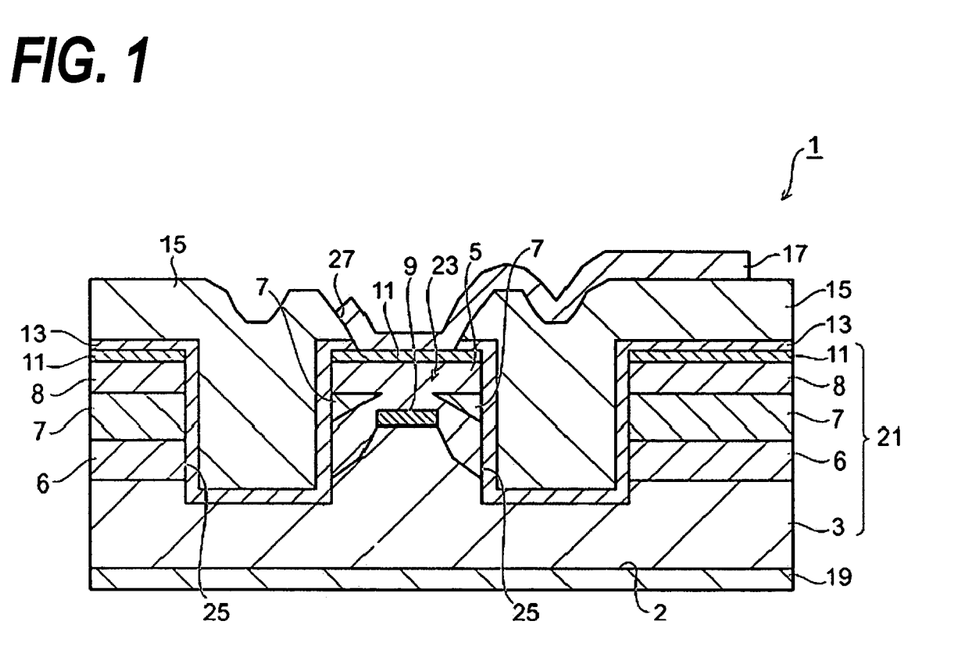
FIG. 1 is a schematic cross section of the semiconductor optical device according to the first embodiment.

FIG. 1 is a cross section schematically showing a semiconductor optical device according to the first embodiment. The optical device 1 shown in FIG. 1 includes a layered structure 21 having a mesa 23, a first insulating layer 13 formed on the layered structure 21, a second insulating layer 15 provided on the first insulating layer, and an electrode 17 formed on the second insulating layer 15. The mesa 23 includes an active layer with a quantum well structure, while the second insulating layer 15 is formed so as to bury this mesa 23. The second insulating layer 15 forms an opening 27 in the top of the mesa 23 to come the electrode 17 in contact with the mesa 23 via the opening 27.

The layered structure 21 includes a semiconductor substrate 3 with a first conduction type, a semiconductor layer 6 provided on the substrate 3, a semiconductor layer 7 with the first conduction type that is formed on the semiconductor layer 6, a semiconductor layer 8 with the second conduction type that is formed on the semiconductor layer 7, and a contact layer 11 formed on the semiconductor layer B. The upper electrode 17 comes in contact with the contact layer 11 at the top of the mesa 23.

The layered structure 21 forms a trench 25 penetrating into the contact layer 11, and semiconductor layers, 6, 7, and 8, to reach the semiconductor substrate 3, and two trenches 25 put the mesa 23 therebetween. Within the trench 25 is formed with the first and second insulating layers, 13 and 15. The second insulating layer 15 fills the trench 25. The first and second insulating layers are made of at least a material selected from a group of $SiO_2$, SiN, SiON, $Al_2O_3$, and $ZrO_2$, and formed by the inductive coupling plasma-enhanced chemical vapor deposition, the ICP-CVD. The semiconductor substrate 3 and layers, 6 to 8, are made of a group III-V compound semiconductor material, for instance, the semiconductor substrate 3 and the layer 7 may be an n-type InP, while, the layers, 6 and 8, may be a p-type InP.

In the semiconductor device described above, because the second insulating layer 15 fills the trench 25, and this second insulating layer is made of material described above, the electrode 17 may be securely in contact with the insulating layer 15 therebeneath to strengthen the electrode 17 against the peeling it off at the wire-bonding. Moreover, the thermal conductivity of the second insulating layer 15 is greater than that of the resin, so the heat generated in the mesa 23 may be effectively dissipated from the mesa 23.

The thickness of the second insulating layer 15 may be greater than 2 μm. In order to thicken the second insulating layer 15, several conditions may be premised that the internal stress of the insulating layer 15 is below a preset value, for example, below 50 MPa. When these conditions are satisfied, then cracks may be prevented from causing in the second insulating layer 15.

The optical device 1 shown in FIG. 1 provides the first insulating layer between the layered structure 21 and the second insulating layer 15, and, this first insulating layer is formed by the atmospheric chemical vapor deposition (a-CVD), accordingly, the layered structure 21 may be escaped from the damage caused at the process for forming the second insulating film 15 by the ICP-CVD.

The first insulating layer 13 may be omitted depending on the process condition for forming the second insulating layer 15 by the ICP-CVD. When the process condition is so soft that the layered structure may be escaped from the damage of the plasma, then the second insulating layer 15 may be formed directly on the layered structure 21.

Second Embodiment

Figure 2:
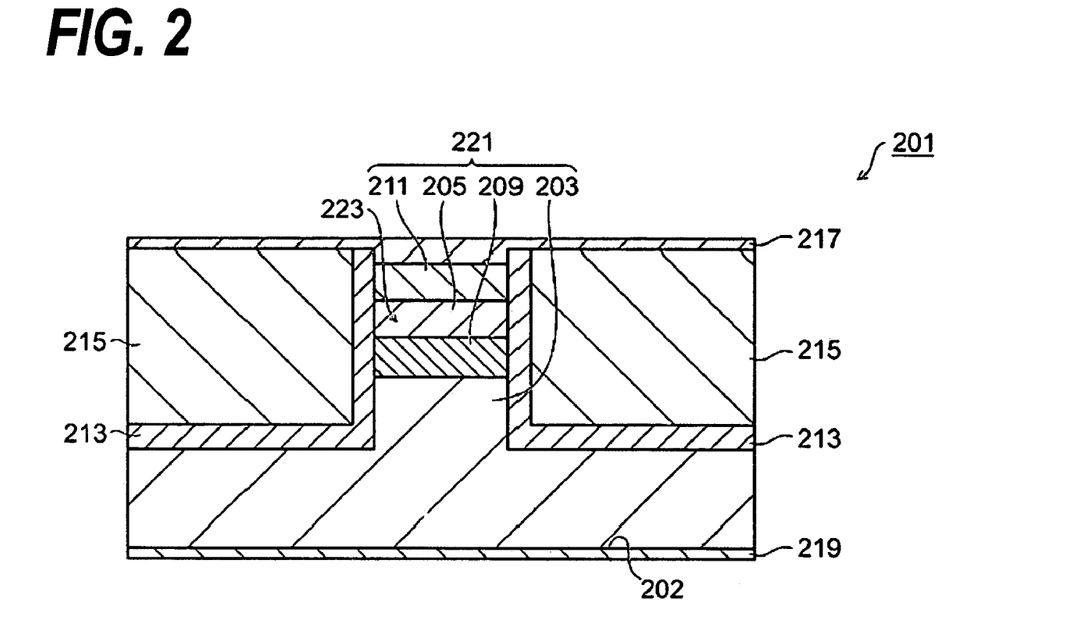
FIG. 2 is a schematic cross section of the semiconductor optical device according to the second embodiment.

FIG. 2 shows a schematic cross section of a semiconductor optical device according to the second embodiment. The optical device 201 shown in FIG. 2 includes a semiconductor substrate 203, a mesa 223 including a portion of the substrate 203, and first and second insulating layers, 213 and 215, burying the mesa 223. The mesa includes an active layer 209, and on the active layer 209 is formed with an upper electrode 217 via a semiconductor layer 205 and a contact layer 211.

The first and second insulating layers, 213 and 215, are made of a material selected from a group of $SiO_2$, SiON, SiN, $Al_2O_3$, and $ZrO_2$. At least the second insulating layer 213 is formed with the ICP-CVD method. The first and second insulating layers, 213 and 215, configure the current confinement structure to concentrate the current in the mesa 223 by putting the mesa 223 therebetween. The semiconductor substrate 203 may be the n-type InP, while, the semiconductor layer 205 may be the p-type InP.

The optical device 201 provides the second insulating layer 215 made of a material mentioned above, and the upper electrode 217 is formed on this second insulating layer 215, accordingly, the electrode 217 shows a secure adhesion to the second insulating layer 215. Moreover, the thermal conductivity of the insulating layer 215 is generally greater than that of resin, accordingly, the heat generated in the mesa 223 may be effectively dissipated therefrom. Still further, the insulating layers, 213 and 215, bury the mesa 223 in this optical device 201, accordingly, the production cost may be reduced. Since the second insulating layer 215 is formed such that the surface of the layer 215 coincides with the top of the mesa 223, the optical device 201 may be planar.

The thickness of the second insulating layer 215 may be greater than 2 μm. To thicken the insulating layer 215 requires similar conditions to those mentioned in accompanying with the first embodiment. In the present embodiment, because the second insulating layer 215 is formed by the ICP-CVD method, the layer 215 may be obtained in thick without internal stress. Further, also in the present embodiment, because the first insulating layer 213 is interposed between the second insulating layer 215 and the substrate 203 and the mesa 223, formed by the ACVD method, the plasma damage affected by the formation of the ICP-CVD for the deposition of the second insulating layer 215 may be reduced.

The first insulating layer 213 may be omitted depending on the condition for the formation of the second insulating layer 215. When the condition of the formation is soft for the damage caused by the plasma at the ICP-CVD, the second insulating layer 215 may be deposited directly on the substrate 203 and the side surface of the mesa 223.

Third Embodiment

Next, the process for manufacturing the optical device according to the first embodiment will be described.

Figure 5A:
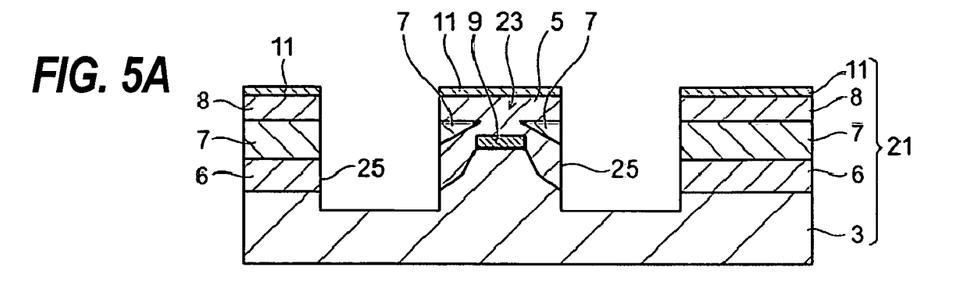
FIGS. 5A to 5C are cross sections schematically showing processes to manufacture the semiconductor optical device of the first embodiment.
Figure 6A:
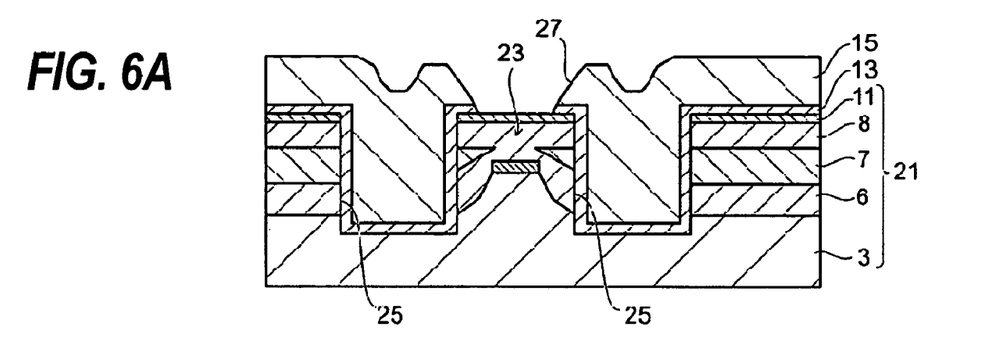
FIGS. 6A and 6B are cross-sections schematically showing processes, subsequent to that shown in FIG. 7C, to manufacture the semiconductor optical device of the first embodiment.
Figure 6B:
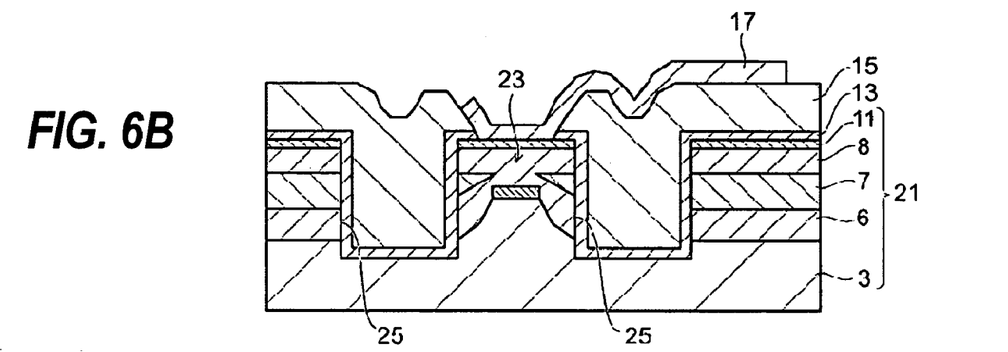
Figure 7:
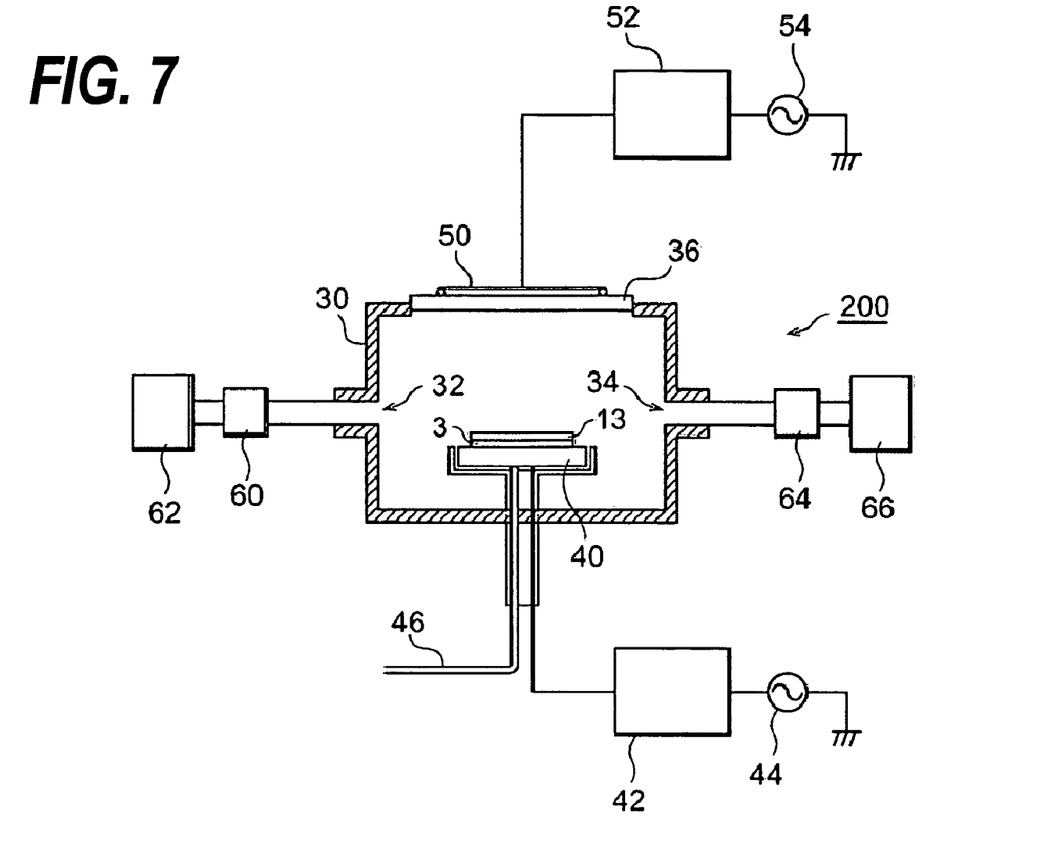
FIG. 7 schematically shows the inductive coupling plasma-enhanced CVD apparatus for producing the semiconductor optical device of the first and second embodiments.

FIGS. 3A to 3C and FIG. 4A are perspective cross sections showing the process for manufacturing the optical device of the first embodiment. FIGS. 4B, FIGS. from 5A to 5C, and FIGS. 6A and 6B are schematic cross sections showing the process subsequent to that shown in FIG. 4A. FIG. 7 schematically shows an apparatus for the ICP-CVD method.

Growing Layered Structure

Figure 3A:
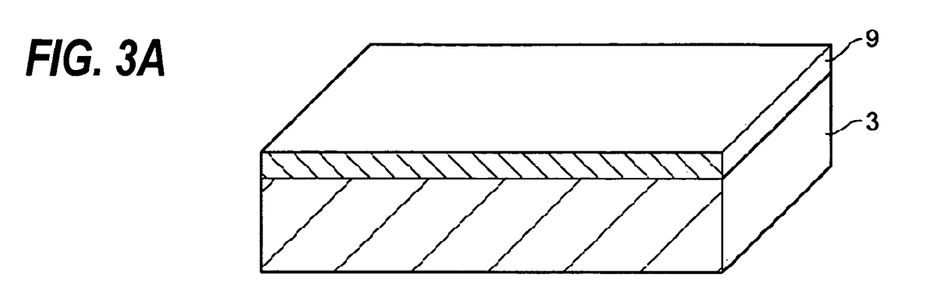
FIGS. 3A to 3C show processes to manufacture the semiconductor optical device of the first embodiment.
Figure 3B:
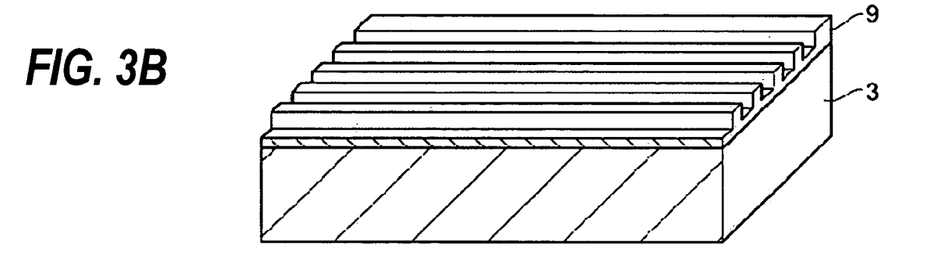
Figure 3C:
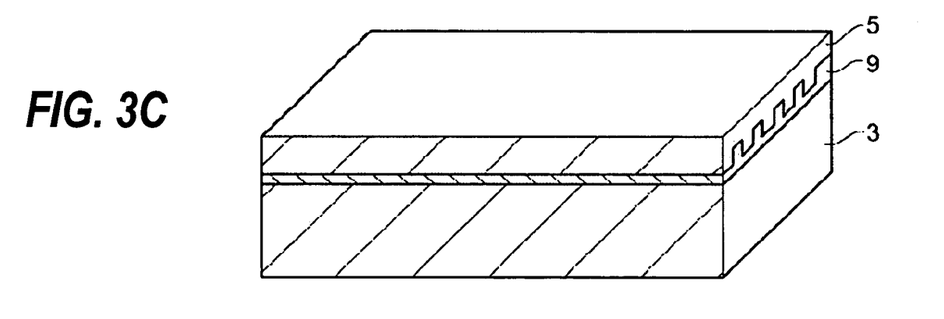

As shown in FIG. 3A, on the semiconductor substrate 3 with the first conduction type, for instance, the n-type InP substrate, is formed with a semiconductor layer 9 having a quantum well structure. A grading is formed on the substrate 3 by the etching of the active layer 9. Next, as shown in FIG. 3B, on the active layer 9 is grown with the semiconductor layer 5 with the second conduction type, for instance, the p-type InP layer.

Figure 4A:
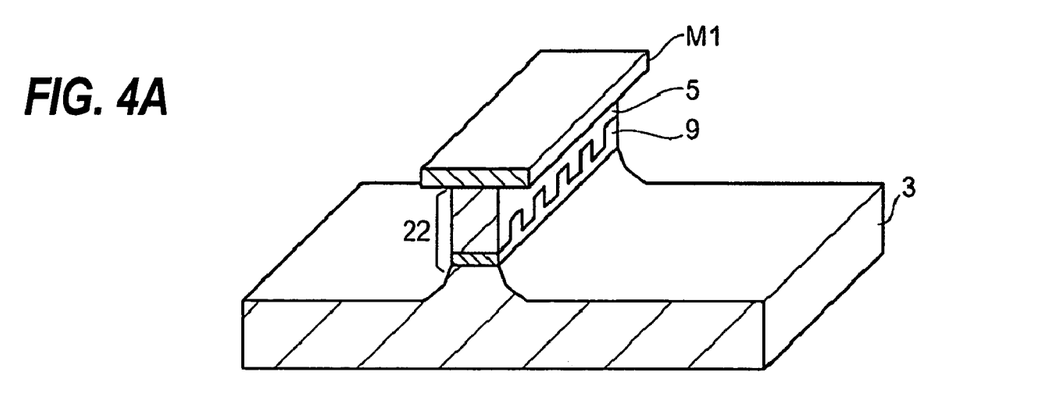
FIG. 4A shows a process, subsequent to that shown in FIG. 5C, to manufacture the semiconductor optical device of the first embodiment.
Figure 4B:
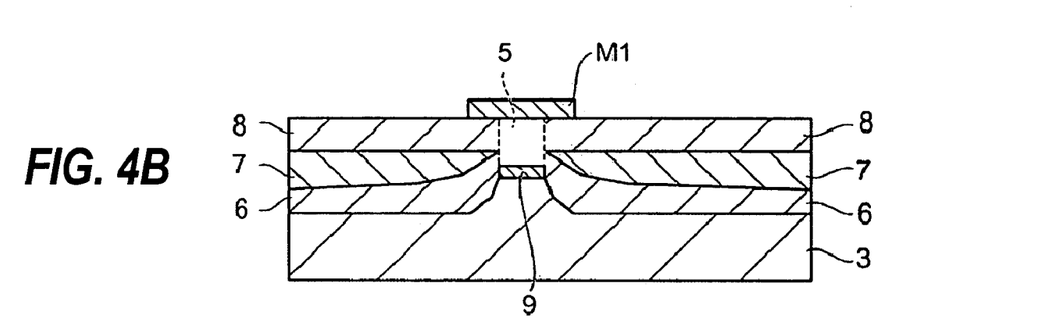
FIGS. 4B and 4C show cross sections of the process to manufacture the semiconductor optical device subsequent to that shown in FIG. 4A.
Figure 4C:
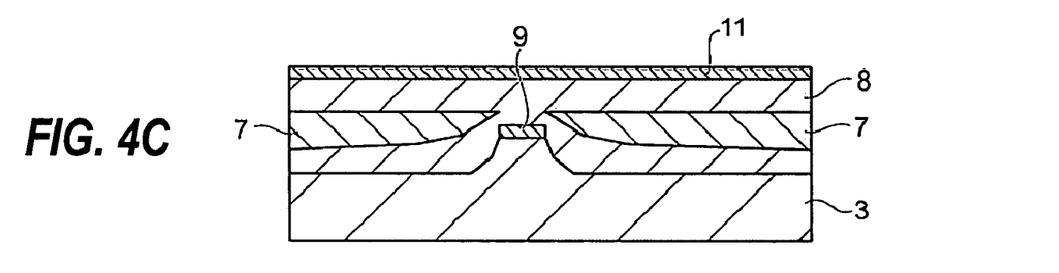

Next, as shown in FIG. 4A, a mask M1 is deposited on the semiconductor layer 5 to etch the semiconductor layer 5, the active layer 9, and a portion of the substrate 3. These layers of the semiconductor layer 5, the active layer 9, and a portion of the substrate 3 are arranged in a mesa 22. Next, as shown in FIG. 4B, a semiconductor layer 6 with the second conduction type, another semiconductor layer 7 with the first conduction type, and the semiconductor layer 8 with the second conduction type 8 are sequentially grown on the substrate 3 to bury the mesa 22. After removing the mask M1, the contact layer 11 is formed on the semiconductor layer 5 as shown in FIG. 4C Forming Trench Next, the trench 25 is formed by etching the contact layer 11, the semiconductor layers, 6 to 8, and a portion of the substrate 3. This etching may be carried out by, what is called, the wet-etching or the dry-etching using the reactive-ion-etching (RIE) technique. By forming a pair of trenches 25 so as to put the mesa including the active layer 9, the semiconductor layer 6, and a portion of the substrate 3 therebetween, a mesa portion 23 includes the mesa 22 above mentioned and the semiconductor layers, 6 to 8, burying this mesa 22. The mesa portion 23 includes the active layer 9 that is sandwiched in up and down directions by two semiconductor layers each having opposite conduction types and is buried by the series of the semiconductor layers, 6 to 8 (FIG. 5A). Thus, the layered structure 21 including the active layer may be formed by the contact layer 11, the semiconductor layers, 6 to 8, and the substrate 3.

Forming First Insulating Layer

Figure 5B:
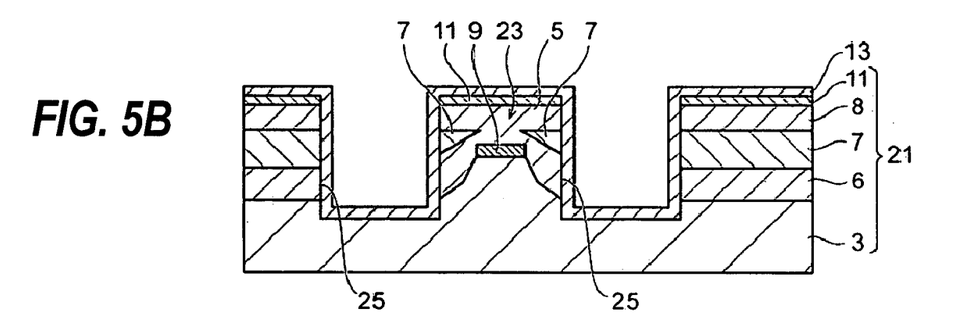

Next, as shown in FIG. 5B, the first insulating layer 13 is formed on the layered structure 21 by the CVD technique. The first insulating layer 13 may be made of $SiO_2$, SiN, SiON, $Al_2O_3$, or $ZrO_2$. The CVD technique may include the thermal CVD and the atmospheric CVD.

Forming Second Insulating Layer

Figure 5C:
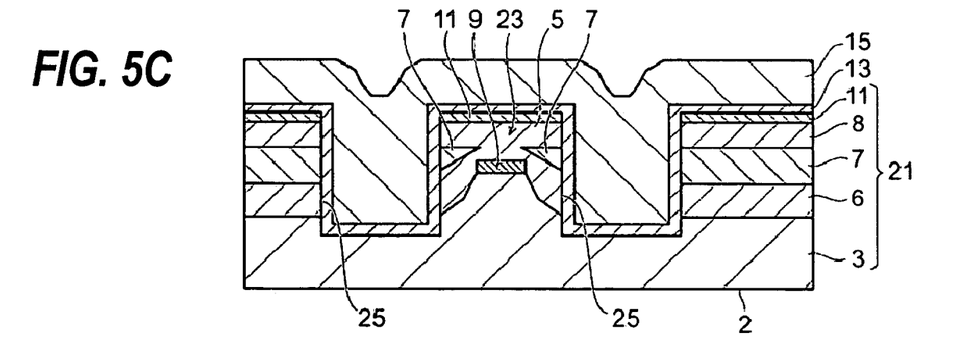

Next, as shown in FIGS. 5C and 6A, the second insulating layer 15 is formed on the stacked structure 21 so as to bury the mesa portion 23. The second insulating layer 21 may be deposited by the ICP-CVD technique by using the apparatus shown in FIG. 7. In the present embodiment the insulating layers, 13 and 15, are etched to expose the surface of the contact layer 11 on the mesa 23.

The apparatus 200 for the ICP-CVD technique shown in FIG. 7 includes a chamber 30 and a susceptor 40 for holding the semiconductor substrate 3 that is covered by the insulating layer 13. The chamber 30 provides a port 32 for supplying the process gasses and another port 34 for exhausting the process gasses. The port 32 couples with the gas source 62 via the mass-flow-controller (MFC) 60, while, the other port 34 couples with the vacuum pump 66 via the displacement adjustor valve 64.

The chamber 30 also provides a window 36 facing the susceptor 40 to guide the high frequency field into the chamber 30. This high frequency field is generated by the coil 50 arranged outside of the chamber 30. The susceptor 40 couples with the signal generator 44 via the impedance-matching circuit 42. This signal generator 44 applies the signal with a frequency from several hundreds kilohertz to several megahertz and power from several decades to several hundreds watt to the susceptor 40. The susceptor 40 couples with a pipe 46 to circulate a coolant, which suppresses the temperature rise of the susceptor 40 due to the application of the high frequency signal.

The coil 50 generates the inductive coupling plasma (ICP) within the chamber 30. The coil 50 couples with the source 54 for the high frequency signal via the impedance matching circuit 52. This source 54 applies a high frequency signal with a frequency of several decades megahertz and power from several hundreds watt to several kilowatt to the coil 50.

The insulating layer 15 may be deposited, by the ICP-CVD apparatus described above, as follows: first, placing the semiconductor substrate 3 on the susceptor 30, supplying the process gasses from the port 32 within the chamber 30, and generating the plasma in the chamber by applying the high frequency signal to the coil 50. In this process, the susceptor 40 is also applied a high frequency signal so as to bury the trench 25 formed in the layered structure on the substrate 3. Because of the ICP-CVD technique, the insulating layer 15 may be deposited in thick over 2 μm without internal stresses under relatively low temperature about 400° C. Then, this insulating layer 15 is etched with the insulating layer 13 on the mesa portion 23 to expose the contact layer 11 by the opening 27.

Gaseous oxygen and gaseous organic metal including organic silicon compound such as TEOS may be used as the process gasses. The high frequency applied to the coil 50 may have a frequency from 1 MHz to 20 MHz and power thereof from 500 W to 2000 W, while, the other high frequency applied to the susceptor 40 may have a frequency from 0.1 MHz to 1 MHz and power from 100 to 1000 W. The ratio of the power P2 to the other power P1, where the former is the power of the high frequency signal applied to the susceptor 40 and the latter is that applied to the coil 50, may be between 1/100 and 1/10 . By setting the ratio (P2/P1) in the range above described, a condition may be obtained for the insulating layer 15 without the internal stress and with a high deposition rate.

When the insulating layer 15 is SiO2 and the condition for the deposition are shown below, the deposition rate over 300 nm/min may be achieved.

| Table Deposition Conditions of the ICP-CVD | |
|---|---|
| Gas Source | |
| TEOS flow rate | 10 sccm |
| Gaseous oxygen | 100 sccm |
| Deposition pressure | 5 Pa |
| Signal source | |
| Signal applied To coil 54 | 1000 W, 13.56 MHz |
| Signal applied to susceptor 40 | 100~300 W, 140 kHz |
| Temperature of the substrate | 400° C. |

By the condition above listed, the $SiO_2$ layer with the thickness of 4 μm may be deposited by 30 minutes.

Process for Forming Electrode

Next, the electrode 17 is formed on the insulating layer 15 with the opening 27 on the mesa portion 23 by, for example, the conventional lift-off technique, as shown in FIG. 6B. Subsequently, the other electrode 19 is formed on the other surface 2 of the-substrate 3.

Thus, in the process above described, the ICP-CVD technique forms the insulating layer 15, and a relatively high deposition rate may be achieved. Moreover, because this technique applies the high frequency signal to the susceptor 40 during the deposition, the internal stress may become adjustable. Therefore, even when the insulating layer is deposited in thick, the layer may escape from cracks due to the internal stress. In particular, the ratio (P2/P1) of the power of the high frequency signals each applied to the susceptor 40 and to the coil 50 is set within the range mentioned above, these advantages may be distinguishable.

The insulating layer 15 may be selected from $SiO_2$, SiN, SiON, $Al_2O_3$ or $ZrO_2$ and any of these materials may enhance the adhesion to the electrode 17 compared with the arrangement that a resin buries the trench 25. Moreover, the thermal conductivity of these materials is higher than that of the resin, the heat generated in the mesa 25 may be effectively dissipated therefrom.

The process may include a step for forming the first insulating layer 13 on the layered structure 21 prior to the deposition of the insulating layer 15. The prior insulating layer 13 enhances the coverage of the subsequent insulating layer 15 and may reduce the plasma damage caused to the semiconductor substrate 3 and the layered structure 21 during the ICP-CVD process. In particular, the insulating layer 13 formed by the a-CVD technique may distinguish these advantages.

Fourth Embodiment

Next, a process for manufacturing the optical device according to the second embodiment will be described as referring to FIGS. 8A to 8C and FIGS. 9A to 9C.

Forming Layered Structure

Figure 8A:
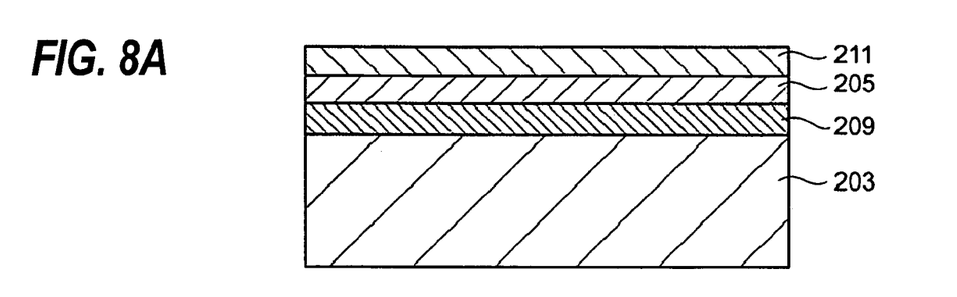
FIGS. 8A to 8C schematically show cross sections of the process to manufacture the semiconductor optical device of the second embodiment.

First, as shown in FIG. 8A, the layer 209 for the active layer, the layer with the second conduction type, and the contact layer 211 are sequentially formed on the substrate 203. The substrate may be an n-type InP. The active layer 209 may have the quantum well structure, and the layer 205 may be a p-type InP.

Forming Mesa

Figure 8B:
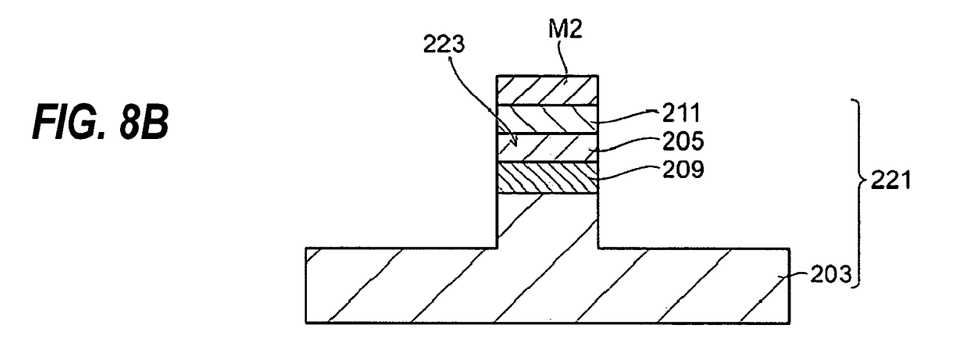

Next, as shown in FIG. 8B, after forming the mask M2 on the contact layer 211, the mesa 223 is formed by etching the contact layer 211, the layers, 205 and 209, and a portion of the substrate 203 using the mask M2. These layers of the contact layer 211, the layers 205, the active layer 209, and the substrate 203 forms the layered structure 221 including the mesa 223.

Forming First Insulating Layer

Figure 8C:
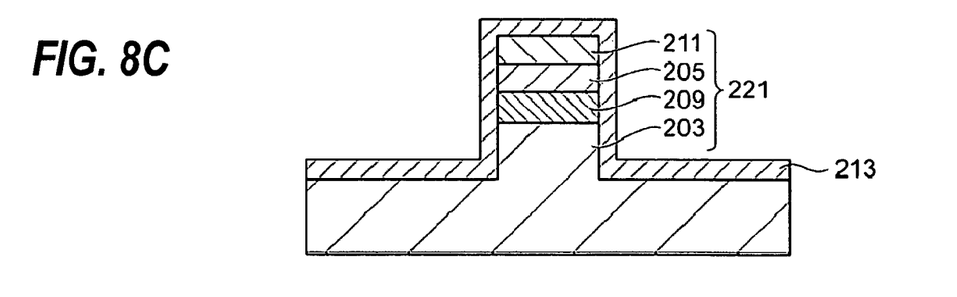

Next, as shown in FIG. 8C, the first insulating layer 213 is formed on the layered structure 221 by CVD method. The insulating layer 213 may be $SiO_2$, SiN, SiON, $Al_2O_3$, and $ZrO_2$, while, the CVD method may be the thermal CVD, the plasma-enhanced CVD, or atmospheric CVD, these are the conventional CVD method.

Forming Second Insulating Layer

Figure 9A:
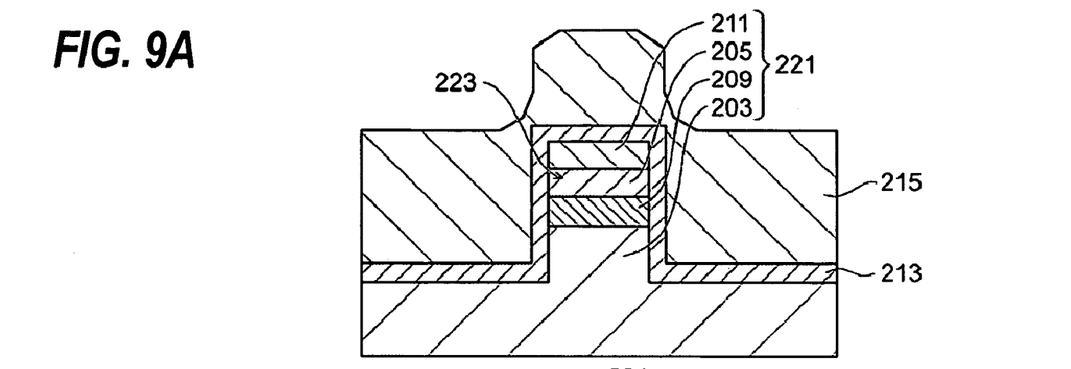
FIGS. 9A to 9C schematically show cross sections of the process, subsequent to that shown in FIG. 8C, to manufacture the semiconductor optical device of the second embodiment.
Figure 9B:
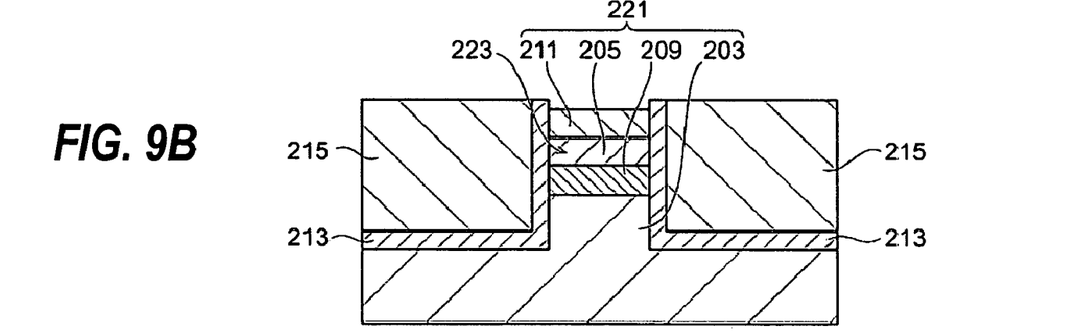

Next, as shown in FIGS. 9A and 9B, the second insulating layer 215 is formed on the first insulating layer 213 so as to bury the mesa 223. The second insulating layer 215 may be deposited by the ICP-CVD apparatus 200 previously described in FIG. 7. Specifically, after forming the second insulating layer 215 on the first insulating layer 213, these layers, 213 and 215, are etched back to make the surface of these layers, 213 and 215, planar. Here, depending on the condition for forming the second insulating layer by the ICP-CVD technique, the plasma damage caused to the substrate 203 and the mesa 223 may be escaped. In such case, the second insulating layer 215 may be deposited directly on the substrate 203 and the mesa 223 without interposing the first insulating layer 213. The second insulating layer 215 may be $SiO_2$, SiN, SiON, $Al_2O_3$ or $ZrO_2$ similar to the first embodiment.

Forming Electrodes

Figure 9C:
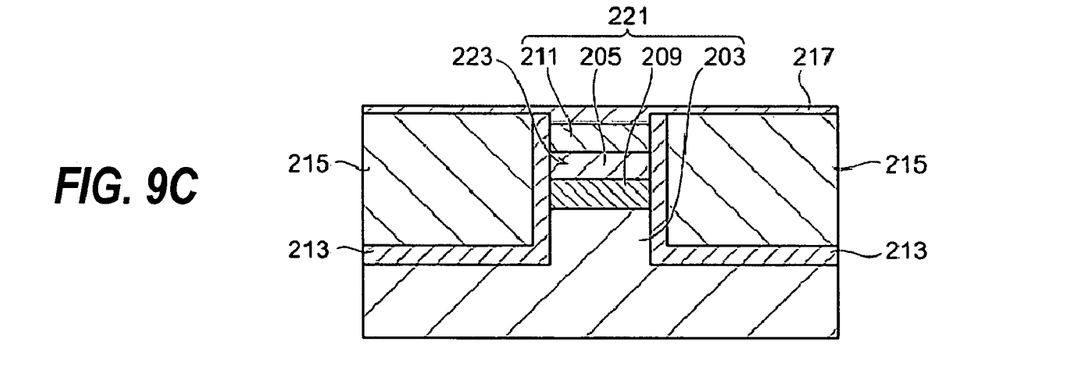

Next, as shown in FIG. 9C, the electrode 217 is formed on the second insulating layer 215 and on the mesa 223 in a portion where the second insulating layer 215 is removed. The other electrode 219 is formed on the other surface 202, as shown in FIG. 2.

Thus, in the process for forming the optical device 201, the ICP-CVD technique forms the insulating layer 215, a relatively high deposition rate may be achieved without inducing the internal stress. The insulating layer 215 may be selected from $SiO_2$, SiN, SiON, $Al_2O_3$ or $ZrO_2$ and any of these materials may enhance the adhesion to the electrode 217. Moreover, the thermal conductivity of these materials is higher than that of the resin, the heat generated in the mesa 25 may be effectively dissipated therefrom.

The process may include a step for forming the first insulating layer 213 on the layered structure 221 prior to the deposition of the insulating layer 215. The prior insulating layer 213 enhances the coverage of the subsequent insulating layer 215 and may reduce the plasma-damage caused to the semiconductor substrate 203 and the layered structure 221 during the ICP-CVD process. In particular, the insulating layer 213 formed by the a-CVD technique may distinguish these advantages.

Moreover, depending on the condition of the ICP-CVD technique for forming the second insulating layer 213, the plasma damage caused to the substrate 203 and the mesa 223 may be escaped. In such case, the second insulating layer 215 may be deposited directly on the substrate 203 and the mesa 223 without interposing the first insulating layer 213.

What is claimed is:

1. A method for manufacturing a semiconductor laser diode comprising steps of:
   (a) forming semiconductor layers sequentially on a semiconductor substrate, the semiconductor layers including an active layer and each being made of compound semiconductor materials;
   (b) forming a mesa including the active layer by etching the semiconductor layers and a portion of the semiconductor substrate;
   (c) forming buried layers each made of compound semiconductor material to bury the mesa;
   (d) etching the buried layers and a portion of the semiconductor substrate so as to form a pair of trenches sandwiching the mesa therebetween;
   (e) completely filling the trenches with an insulating layer made of material selected from one of $SiO_2$, SiN, SiON, $Al_2O_3$ and $ZrO_2$ by using an inductive coupling plasma enhanced chemical vapor deposition with an organic silicon compound as a source material; and
   (f) forming an electrode on the insulating layer,
   wherein the inductive coupling plasma enhanced chemical vapor deposition is carried out to provide a first signal with a first frequency to a susceptor and another signal with a second frequency higher than the first frequency to a coil of an apparatus of the inductive coupling plasma enhanced chemical vapor deposition,
   wherein the first signal has power range of 1/100 to 1/10 with respect to power of the second signal, and
   wherein the power of the first signal is 100 to 1000W, and the power of the second signal is 500 to 2000 W.

2. The method according to claim 1,
   wherein the insulating layer has a top surface swelled from a top of the mesa, and the method further includes, between step (e) and step (f), a step of etching the insulating layer so as to make the top surface of the insulating layer planar with respect to the top of the mesa.

3. The method according to claim 1,
   further including, between step (d) and step (e), a step for forming another insulating layer on a top of the mesa and on a surface of the buried layer, and, between step (e) and step (f), a step of etching the insulating layer and the other insulating layer to expose a top of the mesa,
   wherein the insulating layer is formed on the other insulating layer so as to fill the trenches completely.

4. The method according to claim 3,
wherein the other insulating layer is made of $SiO_2$ formed by the atmospheric chemical vapor deposition.

5. The method according to claim 1,
wherein the insulating layer has a thickness greater than 2 μm in step (e).

6. The method according to claim 1,
wherein the first signal has a frequency from 0.1 to 1 MHz and the second signal has a frequency from 1 to 20 MHz.

7. A method for manufacturing a semiconductor laser diode comprising steps of:
   (a) sequentially growing semiconductor layers each made of compound semiconductor material on a semiconductor substrate, the semiconductor layers including an active layer;
   (b) etching the semiconductor layers and a portion of the semiconductor substrate to form a mesa that includes the active layer;
   (c) selectively growing a buried layer on a side of the mesa so as to bury the mesa, the buried layer being made of compound semiconductor material;
   (d) etching the buried layer and a portion of the semiconductor substrate so as to form a trench apart from the mesa;
   (e) forming an insulating layer that is made of material selected from one of $SiO_2$, SiN, SiON, $Al_2O_3$ and $ZrO_2$ on the mesa, on the buried layer and within the trench so as to fill the trench completely by the inductive coupling plasma enhanced chemical vapor deposition with an organic silicon compound as a source material;
   (f) forming an opening in the insulating layer to expose a top of the mesa; and
   (g) forming an electrode on the top of the mesa exposed in the opening and on the insulating layer,
wherein the inductive coupling plasma enhanced chemical vapor deposition is carried out to provide a first signal with a first frequency to a susceptor and another signal with a second frequency higher than the first frequency to a coil of an apparatus of the inductive coupling plasma enhanced chemical vapor deposition,
wherein the first signal has power range of 1/100 to 1/10 with respect to power of the second signal, and
wherein the power of the first signal is 100 to 1000W, and the power of the second signal is 500 to 2000 W.

8. The method according to claim 7,
wherein the first signal has a frequency from 0.1 to 1 MHz and the second signal has a frequency from 1 to 20 MHz.

* * * * *